United States Patent [19]

Hu et al.

[11] 3,953,842
[45] Apr. 27, 1976

[54] BUBBLE LATTICE INITIALIZATION

[75] Inventors: Hung Liang Hu; William Albert Reynolds, Jr.; Laurence Lee Rosier, all of San Jose, Calif.

[73] Assignee: International Business Machines Corporation, Armonk, N.Y.

[22] Filed: Oct. 25, 1974

[21] Appl. No.: 517,990

[52] U.S. Cl. .......................................... 340/174 TF
[51] Int. Cl.² ........................................ G11C 11/14
[58] Field of Search ................. 340/174 SR, 174 TF

[56] References Cited
UNITED STATES PATENTS

| | | | |
|---|---|---|---|
| 3,753,814 | 8/1973 | Pulliam | 340/174 TF |
| 3,869,683 | 3/1975 | Sokolski | 340/174 TF |
| 3,876,996 | 4/1975 | Myer | 340/174 TF |

OTHER PUBLICATIONS

Amer. Inst. of Physics, AIP Conf. Proc., No. 5 Part 1, "Bubble Lattices" by DeJonge et al., pp. 130–134; 11/16–19/71.

IBM Tech. Disc. Bull., "Bubble Domain Devices in Magnetic Sheets of Variable Thickness" by Ramankin, Vol. 14, No. 6, 11/71; pp. 1806, 1807.

Bell System Tech. Journal, "Properties & Device Applications of Magnetic Domains in Orthoferrites" by Bobeck, Vol. XLVI, No. 8, 10/67, pp. 1901–1925.

*Primary Examiner*—James W. Moffitt
*Attorney, Agent, or Firm*—Joseph E. Kieninger

[57] ABSTRACT

A method of providing an initial lattice containing magnetic bubble domains in a film is disclosed. The method includes a first step of providing a confinement area in a film to contain magnetic domains, a second step of applying an AC in-plane magnetic field to form a plurality of rows of substantially perfect parallel stripe domains, and a third step of cutting the stripe domains into bubbles to form a substantially perfect lattice containing bubble domains.

14 Claims, 8 Drawing Figures

BUBBLE LATTICE INITIALIZATION

FIELD OF THE INVENTION

This invention relates to bubble domain lattices and more particularly to a method of initializing a bubble domain lattice.

BRIEF DESCRIPTION OF PRIOR ART

Bubble domains arranged in a lattice are described in co-pending U.S. Patent Applications, Ser. Nos. 395,336, filed on Sept. 7, 1973 and now abandoned and 494,940, filed on Aug. 5, 1974 and assigned to the Assignee of the present invention. The aforementioned applications are incorporated herewith by reference thereto. As described therein, the bubble domain lattice consists of a plurality of rows and columns of bubble domains which occupy a spatial arrangement which is determined to a substantial extent by the interaction between the bubbles.

Bubble domain lattices have been prepared in a number of different ways which are described in the aforementioned patent applications. One such method of forming a lattice involves a confinement area of bubble domain material in which there are no elements, that is, no bubble domains existing therein. In such a lattice, bubble domains are continually loaded into the lattice until a sufficient number of bubble domains is reached which will provide a regular lattice having a given lattice spacing, that is, an equal distance $A_0$ between the individual bubble domain elements. For example, a lattice having N columns and M rows of bubble domains will require N x M bubble domains to be loaded into the confined area in order to form the desired lattice. While this method may be suitable for bubble domain lattices containing a relatively small number of bubble domains, this method is not suitable for lattices of a size desired for storage devices. Moreover, this method is not compatible with bubble domain lattice designs containing buffer regions having parallel stripe domains.

An alternative technique for forming a lattice of magnetic bubble domains is as follows. A large DC in-plane magnetic field is applied to a confined area of a film of bubble domain material to force the magnetization into the plane of film. In this step, $H_{in\text{-}plane} > H_k$ where $H_{in\text{-}plane}$ is the DC magnetic field applied and $H_k$ is the anisotropy field of the material. Then, the magnetic field is removed, thereby forming a dense random array of bubble domains. The array of bubble domains is then magnetically annealed by a time-varying magnetic field applied perpendicular to the plane of the film to obtain a regular lattice. This method does have the advantage of forming a relatively large lattice containing a substantial number of bubble domain elements in a relatively short time. However, this method will only form a substantially perfect lattice infrequently. In order to form a perfect lattice by this method it is necessary that the exact number of bubble domains be formed. For example, a perfect lattice containing N columns and M rows requires exactly M X N bubble domains. Whenever the number of bubble domains exceeds or is less than M X N, then there are vacancies in the lattice structure and the lattice is not perfect. In such a case, bubble domains must be independently generated and pumped into the lattice to fill the vacancies in order to make it a perfect lattice. As a result, it is difficult to form a perfect lattice by this method without the additional step of filling the vacancies in the lattice.

Another technique for providing an initial lattice involves cutting of stripe domains. In this method, a pattern of stripe domains is produced in a confined region of a film of bubble domain material by a DC magnetic field in the plane of the magnetic sheet. The stripe domains are then cut to provide rows of bubble domains. The cutting device is any device which produces a magnetic field of sufficient amplitude in a direction substantially perpendicular to the magnetic film. This method also has the advantage of providing a large number of bubble domains in a relatively short time. However, the stripe domains that are formed with a DC magnetic field in the plane of the magnetic sheet invariably have irregularities therein. That is, the stripe domains that are formed have a plurality of patterns therein. For example, the confined region may have one portion of parallel stripe domains facing in one direction and a second portion of parallel stripe domains facing a second direction. All of the stripe domains do not face in the same direction and they all are not parallel to each other. As a result of such a pattern, it is difficult to form a substantially perfect lattice.

SUMMARY OF THE INVENTION

It is an object of this invention to provide an improved method of forming a bubble domain lattice.

It is another object of this invention to provide an improved method of bubble domain lattice initialization.

It is yet another object of this invention to provide a method of forming a substantially perfect bubble domain lattice.

These and other objects are accomplished by a method involving the steps of providing a film of magnetic material capable of supporting domains with a confinement region, for example, a region surrounded by a raised strip. An AC in-plane magnetic field is then applied to the confined region, thereby forming a plurality of rows substantially perfect parallel stripe domains oriented in the direction of the applied in-plane field. The stripe domains are then cut to form bubbles, thereby yielding a substantially perfect lattice containing a plurality of rows and columns of bubble domains. Other objects of this invention will be apparent from the following detailed description, reference being made to the accompanying drawings wherein various stages of the bubble domain lattice initialization method are shown.

DESCRIPTION OF THE ILLUSTRATIVE EMBODIMENT

Figure 1:
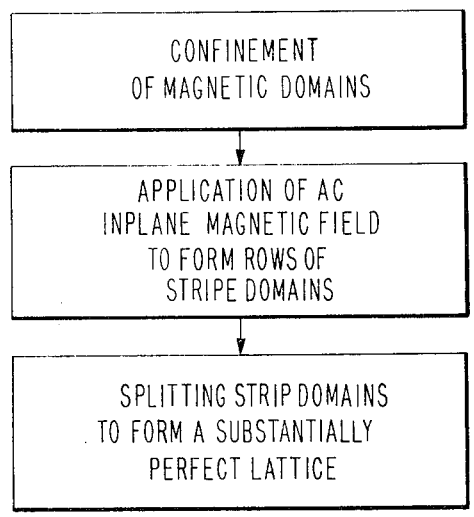
FIG. 1 is a flow diagram depicting the subject method.

As shown in FIG. 1, the first step in providing a substantially perfect lattice of bubble domains is to provide a confinement structure for magnetic domains in a thin film of magnetic material capable of supporting bubble domains. This will be more fully discussed when dealing with FIG. 2.

As shown in FIG. 1, the second step involves the application of an AC in-plane magnetic field to the film to form substantially parallel rows of stripe domains. This will be more fully discussed when dealing with FIG. 3.

As shown in FIG. 1, the third step involves the splitting of the stripe domains to form a substantially perfect lattice. This will be more fully discussed when dealing with FIGS. 3 through 8.

Figure 2:
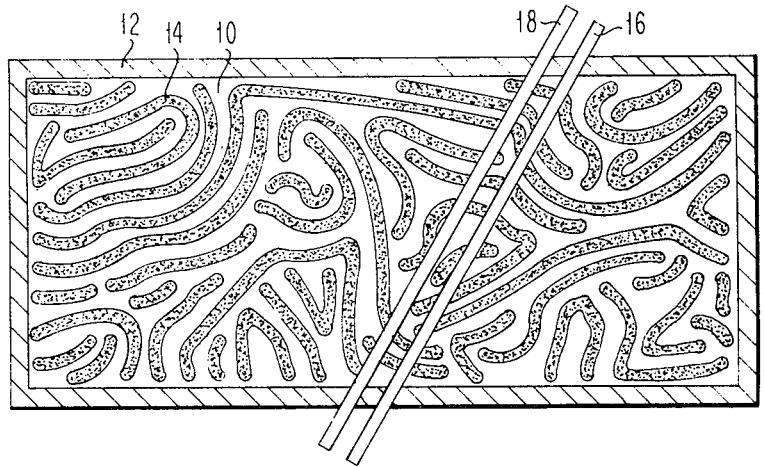
FIGS. 2 through 8 are top views of a film of bubble domain material illustrating various stages in the subject method.

In FIG. 2, a film 10 of bubble domain material is provided with a confinement structure 12. The structure 12 may be formed by ion milling or sputter etching and be in the form of a raised portion. The structure can also be a metal conductor with a field applied therein. Magnetic serpentine domains 14 are contained within the structure 12. A pair of metal conductors 16 and 18 are positioned over the film 10 at an angle of 60° ± 5° to the side of the structure 12.

Figure 3:
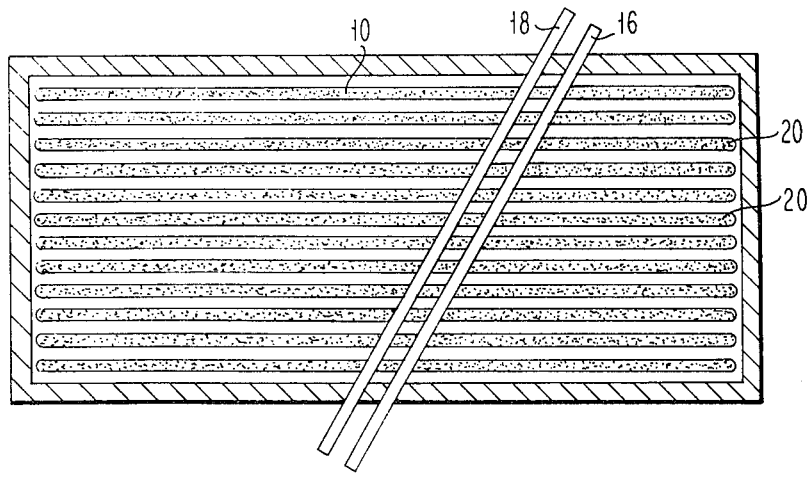
Figure 4:
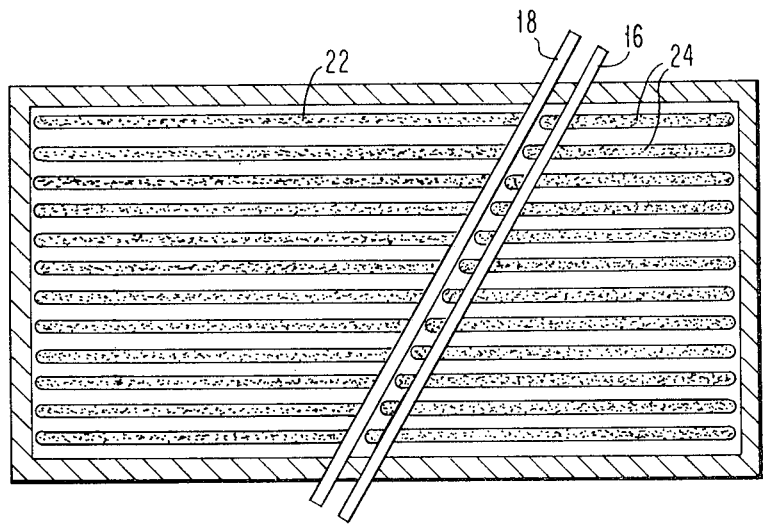

In FIG. 3 an AC in-plane magnetic field has been applied to the film 10 to form a plurality of rows of parallel stripe domains 20. The plurality of rows of stripe domains forms a substantially perfect arrangement. The ability to obtain the rows of stripe domains in a substantially perfect parallel arrangement distinguishes this method from the prior art methods In FIG. 4, the conductor 18 is pulsed thereby splitting the stripe domains into portions 22 and 24. Portions 24 extend under and beyond the conductor 16.

Figure 5:
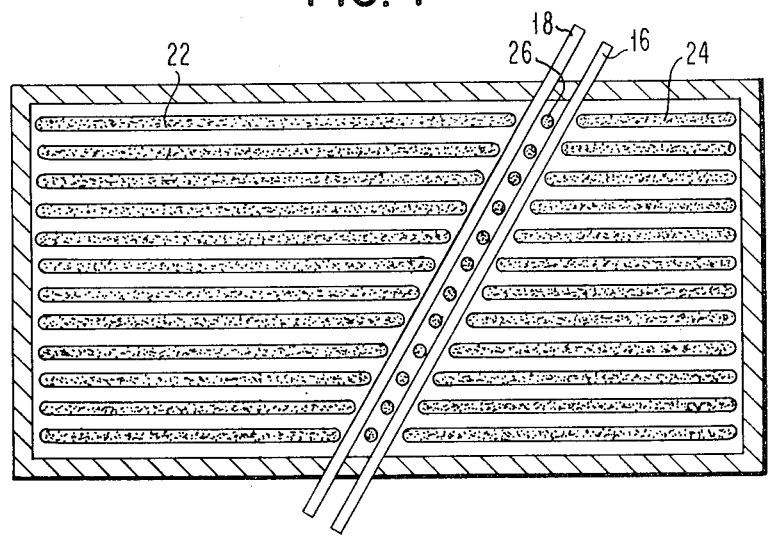

In FIG. 5, the conductor 16 is pulsed thereby splitting the ends of stripe domains 24 to form bubble domains 26. The bubble domains 26 form a column of bubble domains positioned between conductors 16 and 18. The conductors 16 and 18 are positioned at an angle of 60° ± to the stripe domains 22 and 24. The bubble domains 16 are positioned between the conductors 16 and 18

Figure 6:
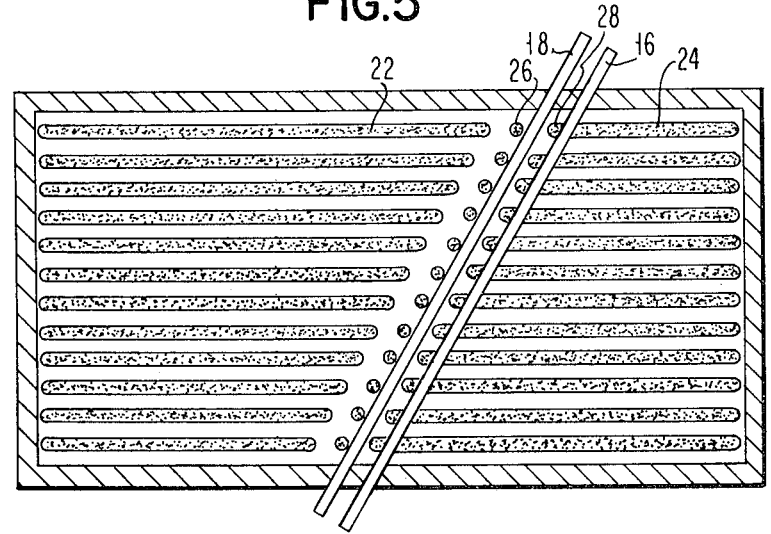

In FIG. 6, a sequence of current pulses is passed through conductors 16 and 18, thereby translating the bubble domains 26 from between conductors 16 and 18 to the side of conductor 18 which is farthest away from conductor 16. A portion of the stripe domain 24 extends under and beyond the conductor 16.

Figure 7:
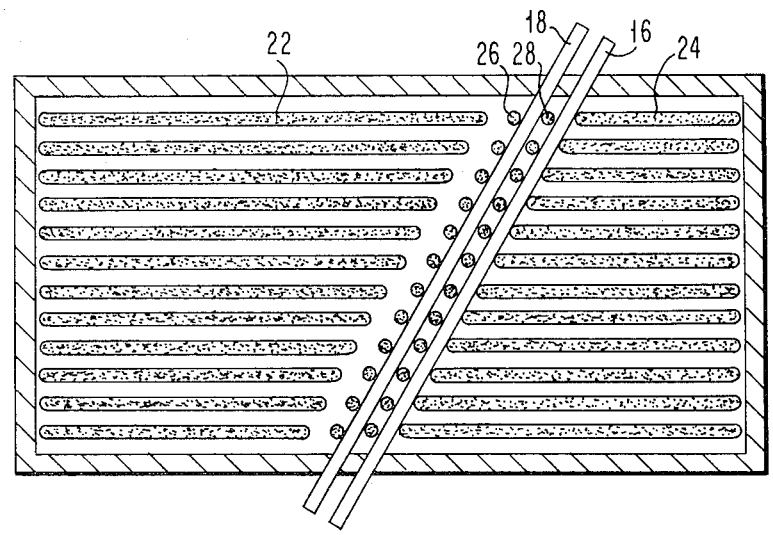

In FIG. 7, a pulse is passed through conductor 16 thereby splitting the ends of stripe domains 24 to form bubble domains 28. The bubble domains 28 form a column of bubble domains positioned between the conductors 16 and 18.

Figure 8:
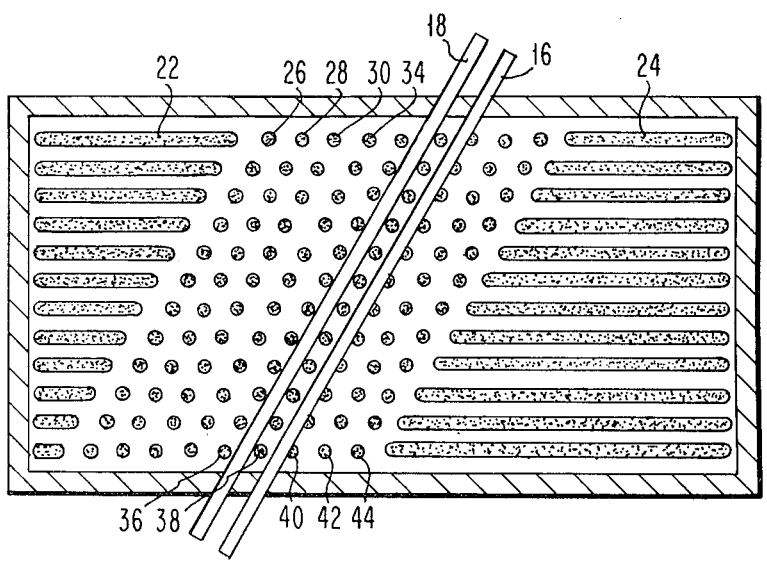

In FIG. 8, a substantially perfect bubble domain lattice is shown containing stripe domains 22 and 24 as well as columns of bubble domains formed of bubble domains 26, 28, 30, 32, 34, 36, 38, 40, 42 and 44. These bubble domain columns may be translated by methods known in the art such as that described later or in co-pending U.S. Patent Application Ser. No. 494,940.

There are a number of additional steps which can be added to the above described method to facilitate the formation of a substantially perfect bubble domain lattice. These steps permit increased control over the formation of the parallel stripe domains as well as the formation of the bubble domains from the stripe domains One of these additional steps consists of applying a small AC magnetic field, for example, 5 oersteds, perpendicular to the film. The strength of this small AC magnetic field is of a size sufficient to modulate the magnetic domains. The application of this field facilitates the formation of the stripe domains.

Another step which is useful in adjusting the number of stripe domains in a given space consists of applying a DC bias magnetic field to the film. This DC magnetic field can be applied perpendicular to the film or it can be applied in the plane of the film. The strength of this DC magnetic field is less than the saturation magnetization of the film material when this field is applied perpendicular to the film. The strength of this DC magnetic field is less than the anisotropy field, $H_k$, of the film material when the DC field is applied in the plane of the film. The application of this field determines the density of the stripe domains in the confined region.

Another step which may useful is changing the temperature of the film. This step can have an affect on the size and number of domain stripes that are formed.

Still another variation is the step of changing the strength of the DC bias magnetic field after the formation of the stripe domains and prior to the formation of the stripe domains. For example, the DC field that is applied during the formation of the stripe domains is 20 oersteds. The strength of this field is increased to 30 oersteds during the bubble domain generation step.

One preferred embodiment of the method for forming a substantially perfect lattice containing bubble domains is as follows. A region of the film of magnetic material is confined. The confinement structure can be formed by ion milling, sputter etching and the like to form a narrow region having a somewhat greater thickness than the region in which the serpentine domains and the bubble domains are to be contained. The confinement structure can also be made by encircling the confined region with either a non-magnetic conductor or a magnetic conductor such as Permaloy. The next step involves forming a serpentine configuration of magnetic domains in the confined region of the film. Many of the films used already have serpentine domains therein. If the film doesn't, they may be formed by any of the numerous methods well known in the art. For example, an AC field of 20 oersteds can be applied perpendicular to the magnetic film to form the serpentine domains. A small AC magnetic field is then applied perpendicular to the confined region. The strength of this AC magnetic field is high enough to be sufficient to modulate the serpentine magnetic domains, for example, 5 oersteds. A DC magnetic field, for example, 20 oersteds, is then applied perpendicular to the confined region. The strength of this DC magnetic field is less than the saturization magnetization of the film material. An AC magnetic field is then applied in the plane of the film. The strength of this AC in-plane magnetic field, for example, 500 oersteds, is sufficient to form a plurality of rows of substantially perfect parallel stripe domains. The AC magnetic field which is perpendicular to the confined region and the AC magnetic field which is in the plane of the film are then removed or reduced to zero. The last step consists of generating the bubble domains from the stripe domains to form a substantially perfect lattice containing bubble domains.

The above described method has been utilized to form substantially perfect lattices of different sizes. One example is a lattice containing 28 columns and 28 rows.

Another preferred embodiment of this method consists of the steps set forth below. A confined structure is formed on the film. Then an in-plane DC magnetic field is applied to the film to saturate the confined region. This in-plane DC magnetic field is then released, thereby forming an array of bubble domains. A small AC magnetic field is applied perpendicular to the confined region. Then a DC bias magnetic field is applied perpendicular to the confined region. A plurality of rows of substantially perfect parallel stripe domains is then formed when an AC magnetic field is applied in-plane to the film. The AC perpendicular and in-plane fields are then removed. The striped domains are then cut to form bubble domains and form a lattice having a substantially perfect array of bubble and stripe domains.

EXAMPLE

A garnet film of EuYGaFe was formed on a $Gd_3Ga_5O_{12}$ substrate by standard liquid phase epitaxial methods. By use of conventional photoresist masking techniques and ion milling, a raised area about 0.5 microns high was produced forming a confinement area having a sharp perpendicular transition region. A thin layer of $SiO_2$ having a thickness of about 1.0 microns was deposited to form a spacer layer. A titanium-gold conductor was deposited by conventional techniques. The film had serpentine domains therein at this point. An AC field having a strength of 5 oersteds was applied perpendicular to the film. Then a DC field having a strength of 20 oersteds was applied perpendicularly to the film. An AC field having a strength of 500 oersteds was then applied in the plane of the film to form a substantially perfect parallel arrangement of stripe domains. The AC perpendicular and in-plane fields were then removed. The DC perpendicular field was increased in strength to 30 oersteds. A current of 200 milliamps was applied to one conductor for about 100 nanoseconds to split the stripe domains into two portions. A current of 200 milliamps was then applied to the adjacent conductor for about 100 nanoseconds to split the bubble from the strip. The column of bubbles was then translated by the following steps. The DC bias field was lowered to 20 oersteds and an AC modulating field of 5 oersteds was applied to the film. A DC current of 8 milliamps was applied for a millisecond in the cutting conductor. Then a DC current of 8 milliamps was applied in the non-cutting conductor to move the column of bubble domains. Additional cutting and translation steps were performed until the desired number of columns of bubbles were formed.

Although several preferred embodiments of this invention have been described, it is understood that numerous variations may be made in accordance with the principles of this invention.

We claim:

1. A method of providing an initial lattice of magnetic bubble domains in a film of magnetic material capable of supporting bubble domains comprising the steps of
    providing said film with a confinement means adapted to contain magnetic domains within a first region of said film,
    applying an AC in-plane magnetic first field to said first region, said first field being of sufficient strength to form a plurality of rows of substantially perfect parallel stripe domains, and
    generating bubble domains from said stripe domains to form a substantially perfect lattice containing bubble domains.

2. A method as described in claim 1 whereby the strength of said field is between 20 to 50% of the anisotropy field, $H_k$, of the material in said first region.

3. A method as described in claim 1 including the step of
    applying a DC bias magnetic second field perpendicular to said first region, said second field being of a strength less than the saturation magnetization of the material in said first region.

4. A method as described in claim 1 including the step of
    applying a DC bias in-plane magnetic third field to said first region, said third field being of a strength less than the anisotropy field, $H_k$, of the material in said first region.

5. A method as described in claim 1 including the step of
    applying a small AC magnetic fourth field perpendicular to said first region, said fourth field being of a strength sufficient to modulate magnetic domains, said fourth field being removed after the formation of said stripe domains and prior to the generation of said bubble domains.

6. A method as described in claim 1 including the step of
    changing the temperature of the material in said first region.

7. A method of providing an initial lattice of magnetic bubble domains in a film of magnetic material capable of supporting bubble domains comprising the steps of
    providing said film with a confinement means adapted to contain magnetic domains within a first region of said film,
    forming a serpentine configuration of magnetic domains in said film,
    applying a small AC magnetic first field perpendicular to said first region, said first field being of a strength sufficient to modulate magnetic domains,
    applying a DC bias magnetic second field perpendicular to said first region, said second field being of a strength less than the saturation magnetization of the material in said first region,
    applying an AC in-plane magnetic third field to said first region, said third field being of sufficient strength to form a plurality of rows of substantially perfect parallel stripe domains,
    removing said first field and said third field, and
    generating bubble domains from said stripe domains to form a substantially perfect lattice containing bubble domains.

8. A method as described in claim 7 including the step of changing the strength of said second field after the formation of the stripe domains and prior to the generation of said bubble domains.

9. A method of providing an initial lattice of magnetic bubble domains in a film of magnetic material capable of supporting bubble domains comprising the steps of
    providing said film with a confinement means adapted to contain magnetic domains within a first region of said film
    applying an in-plane magnetic first field to force the magnetization into the plane of said first region,
    removing said first field to form an array of bubble domains in said first region,
    applying a small AC magnetic second field perpendicular to said first region, said second field being of a strength sufficient to modulate magnetic domains,
    applying a DC bias magnetic third field perpendicular to said first region, said third field being of a strength less than the saturation magnetization of the material in said first region, applying an AC in-plane magnetic fourth field to said first region, said fourth field being of sufficient strength to form a plurality of rows of substantially perfect parallel stripe domains, removing said second field and said fourth field, and generating bubble domains from said stripe domains to form a substantially perfect lattice containing bubble domains.

10. A method as described in claim 9 including the step of changing the strength of said third field after the formation of the stripe domains and prior to the generation of said bubble domains.

11. A method of providing an initial lattice of magnetic bubble domains in a film of magnetic material capable of supporting bubble domains comprising the steps of providing said film with a confinement means adapted to contain magnetic domains within a first region of said film, applying an AC in-plane magnetic first field to said first region, said first field being of sufficient strength to form a plurality of rows of substantially perfect parallel stripe domains, and generating a first column of bubble domains at an angle of 60° ± 5° from one of said rows of said stripe domains.

12. A method as described in claim 11 whereby the generating step includes applying a current pulse through at least one conductor positioned on said first region at an angle of 60° ± 5° from one of said rows of stripe domains.

13. A method as described in claim 12 including the steps of translating said column away from said conductor, and generating a second column of bubble domains parallel to said first column.

14. A method of providing an initial lattice of magnetic bubble domains in a film of magnetic material capable of supporting bubble domains comprising the steps of providing said film with a confinement means adapted to contain magnetic domains within a first region of said film, and applying an AC in-plane magnetic first field to said first region, said first field being sufficient strength to form a plurality of rows of substantially perfect parallel stripe domains.

* * * * *